(12) United States Patent
Numata et al.

(10) Patent No.: US 10,348,052 B1
(45) Date of Patent: Jul. 9, 2019

(54) TUNABLE LASER SYSTEM AND METHOD BASED ON DUAL SIDEBAND LOCKING

(71) Applicant: The United States of America as represented by the Administrator of NASA, Washington, DC (US)

(72) Inventors: Kenji Numata, College Park, MD (US); Haris Riris, Arlington, VA (US); Stewart T. Wu, Ellicott City, MD (US)

(73) Assignee: The United States of America as represented by the Administrator of NASA, Washington, DC (US)

( * ) Notice: Subject to any disclaimer, the term of this patent is extended or adjusted under 35 U.S.C. 154(b) by 8 days.

(21) Appl. No.: 15/715,439

(22) Filed: Sep. 26, 2017

(51) Int. Cl.
*H01S 3/13* (2006.01)
*H01S 3/10* (2006.01)

(52) U.S. Cl.
CPC ........ *H01S 3/1305* (2013.01); *H01S 3/10084* (2013.01); *H01S 3/1304* (2013.01)

(58) Field of Classification Search
CPC ... H01S 3/1305; H01S 3/10084; H01S 3/1304
See application file for complete search history.

(56) References Cited

U.S. PATENT DOCUMENTS 3,534,166 A * 10/1970 Korpel .................... H04N 5/84
   347/232
6,172,952 B1 * 1/2001 Inokuchi ............. G11B 7/0045
   369/44.32

\* cited by examiner

*Primary Examiner* — Dung Nguyen
(74) *Attorney, Agent, or Firm* — Christopher O. Edwards; Bryan A. Geurts; Mark P. Dvorscak

(57) ABSTRACT

The present invention relates to a laser system and method which enables fast, accurate laser frequency tuning. In particular, the present invention includes only one laser and only one absolute frequency locking loop to perform the same fast frequency tuning than previous seed laser systems.

24 Claims, 1 Drawing Sheet

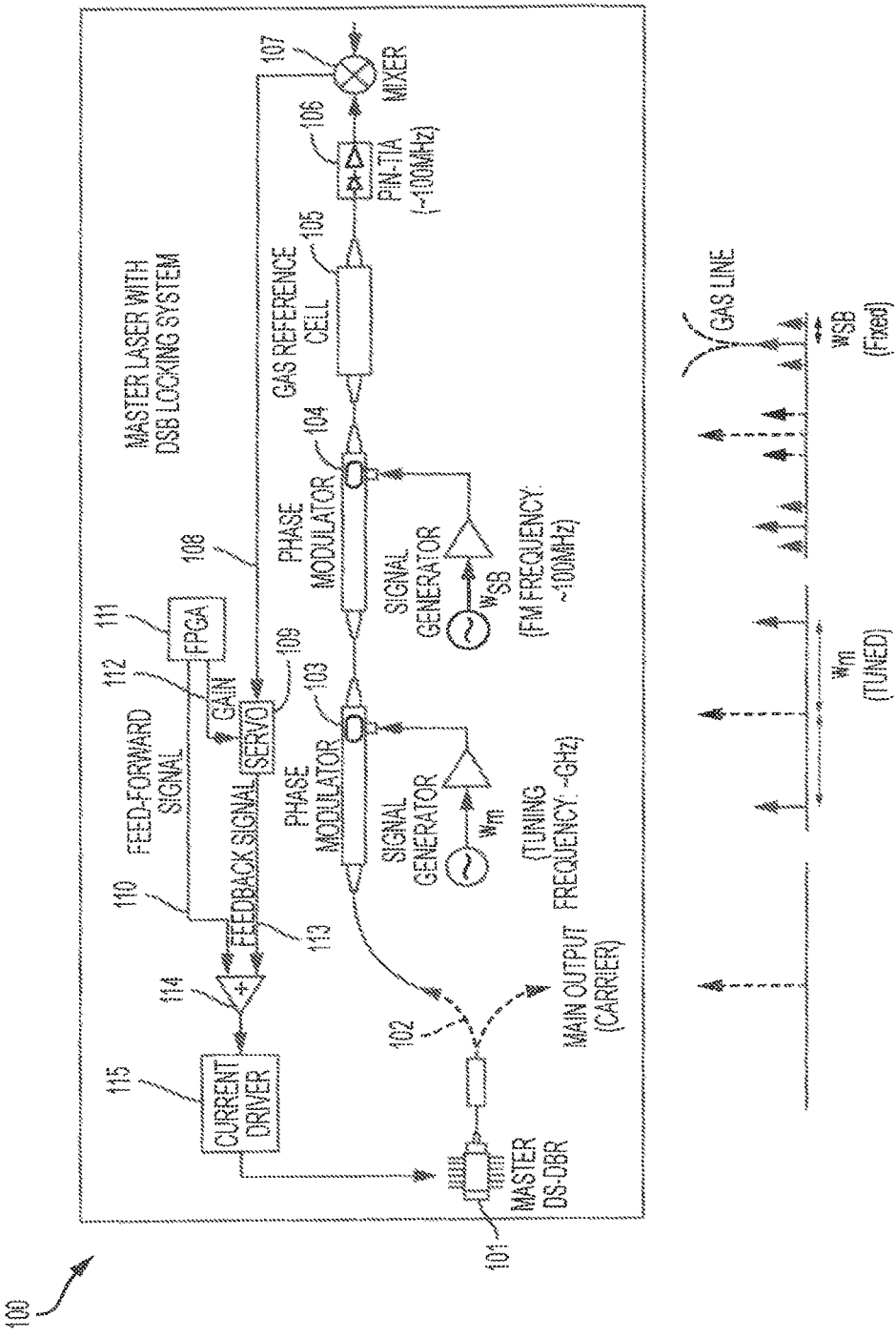

TUNABLE LASER SYSTEM AND METHOD BASED ON DUAL SIDEBAND LOCKING

ORIGIN OF THE INVENTION

The invention described herein was made by an employee of the United States Government, and may be manufactured or used by or for the Government for governmental purposes without the payment of any royalties thereon or therefor.

BACKGROUND OF THE INVENTION

1. Field of the Invention

The present invention relates to a laser system and method which enables fast, accurate laser frequency tuning. The present invention includes only one laser and only one absolute frequency locking loop to perform the same fast frequency tuning than previous seed laser systems.

2. Description of the Related Art

In conventional remote sensing gas lidars, a fast-tunable seed laser is used to scan over the target gas absorption line to perform the spectroscopic measurement. The absolute wavelength of the scanning seed laser must be set and known, to retrieve the column average of the target gas. In conventional systems, this kind of seed laser is realized by two (or more) lasers and two different control servo loops. One of the lasers, called the master laser, is locked to a frequency reference (e.g., gas cell) using an absolute frequency locking loop. This loop uses the optical phase modulation technique to lock onto the peak of the target gas line.

The phase of the other laser, called the slave laser, is offset-phase locked to that of the master laser using a fast-tunable optical phase locked loop (OPLL). In order to change the target offset frequency, the reference radio-frequency (RF) signal, the gain of the servo, and the feed-forward signal of the OPLL, are dynamically changed at the same time. The optical beatnote between the master and slave lasers is detected, frequency-divided, and then fed to a phase-frequency detector to compare the phase with the reference RF signal. Some of the slave lasers output is picked off by an optical coupler (beam splitter), and is used as the frequency-tuned output seed. Outside typical telecom wavelength band, where no fast-tunable laser is available, the same fast frequency stepped output is obtained by optically switching between many static slave lasers phase-locked to the static master laser. This system is called the multiple OPLL scheme, and involves many lasers, servo loops, and optical switches.

In the above conventional system, the seed laser frequency can be tuned by modulating an injection current of a laser diode. However, since the output frequency is very sensitive to the injection current and temperature, it is impossible to achieve ~10 MHz accuracy over the 20 GHz range without the closed-loop control. Since the laser frequency needs to be stepped within ~100 microseconds, the control servo must capture the next target frequency quickly when the target frequency is changed. The target offset frequency from the reference frequency can typically be 0.5-20 GHz, and the frequency can be switched or swept within 0.1 microsecond timescale. When the frequency is stepped, the dynamic absolute frequency locking loop captures the target frequency within ~100 μsec.

There are several disadvantages to the prior art systems. First, the prior-art laser tuning schemes based on an OPLL scheme, involve radio frequency (RF) electronics, such as fast photodetector, frequency divider, and phase frequency detector. They also require a complicated field programmable gate array (FPGA) program to change many loop parameters dynamically at the same time. In addition, two or more lasers are required to realize this scheme. For example, a distributed-feedback (DFB) laser, which is not fast-tunable, is used as the static master laser. Further, a fast-tunable laser, such as a digital-supermode distributed Bragg reflector (DS-DBR) laser, that has a fast-tunable intracavity phase section, is used as the slave laser, if it covers the wavelength of interest.

Finally, the prior-art architectures suffer from the disadvantage that they involve many different electronics and optical components to control the multiple lasers with two different kinds of servo loops.

Thus, a laser system which involves a fast, accurate laser frequency tuning system which has less complicated elements, and can accomplish fast frequency tuning, is desired.

SUMMARY OF THE INVENTION

The present invention relates to a laser system and method which enables fast, accurate laser frequency tuning. In particular, the present invention includes only one laser and only one absolute frequency locking loop to perform the same fast frequency tuning than previous seed laser systems.

The present invention is directed to laser sources which assist programs that improve the ability to predict/model long-term changes in climate cycle based both on the understanding of the natural processes driving the variability of natural carbon sources and sinks, and on the transport of carbon through the atmosphere, as well as the methane lidar program.

In one embodiment, with respect to gas sensing lidars, an optical pulse train is emitted from a laser, whose frequency (wavelength) is stepped across the target gas absorption line. From the intensity variation of the returned pulses, the column average of the target gas can be measured along the optical path. The frequency (wavelength) of the laser pulse is precisely at the target frequencies selected to minimize the measurement error. In the climate change programs of the present invention, the absolute laser frequency error is below ~10 MHz, the pulse switching time is 133 micro-seconds, and the entire scanning range is ~+−12 GHz. The basic laser seeder techniques and requirements for gas lidar missions are similar to those defined for the climate change programs.

In one embodiment, the tunable seed laser of the present invention is a digital-supermode distributed Bragg reflector (DS-DBR) tunable laser. However, one of ordinary skill in the art would know that any fast tunable laser may be used with the present invention.

In one embodiment, a laser frequency tuning system includes: a single phase locking tunable seed laser which emits light at changing target frequencies; at least one phase modulator which modulates light at a fixed frequency, to generate fixed-frequency sidebands around changing frequency sidebands; a frequency reference which receives the phase-modulated light; a detector which detects the phase-modulated light from the frequency reference and produces a first signal; a mixer circuit which demodulates the first signal from the detector at a fixed reference frequency to generate a frequency locking error signal; a servo circuit which converts the error signal into a feedback signal which is forwarded to the tunable seed laser; and a field-programmable gate array (FPGA) which outputs a feed-forward signal, which is forwarded to the tunable seed laser; wherein the feed-forward signal is sent to the tunable seed laser such that a laser frequency of the tunable seed laser falls proximate to an artificial locking frequency point; and wherein the feed-forward signal and a changing target frequency are synchronized and dynamically stepped by the FPGA, such that the laser frequency is controlled and locked to offset frequencies set by a list of said changing target frequency.

In one embodiment, the FGPA outputs a second signal back to the servo circuit.

In one embodiment, the laser frequency tuning system further includes: a summing circuit which adds the feedback signal and the feed-forward signal; and a current driver which drives the summed signal to the tunable seed laser.

In one embodiment, the tunable seed laser is a digital-supermode distributed Bragg reflector (DS-DBR) tunable laser.

In one embodiment, the tunable seed laser is a dual sideband (DSB) locking tunable laser which includes two phase modulators which phase modulate the tunable seed laser twice.

In one embodiment, additional phase modulation is added onto a standard absolute frequency locking system to generate the artificial locking frequency point with a known frequency offset in an absolute frequency locking loop.

In one embodiment, the DSB locking tunable laser covers 20 GHz tuning range at a 100 micro-second timescale.

In one embodiment, two additional frequency locking error signals are generated on both sides of the frequency locking error signal.

In one embodiment, the tunable seed laser can be locked to either side of the frequency reference.

In one embodiment, the changing target frequency is generated from one of a tunable radio frequency (RF) signal generator or an array of RF switches connected to multiple fixed frequency RF signal generators.

In one embodiment, the phase modulator is a single phase modulator used to generate a sideband structure.

In one embodiment, a phase-modulated frequency stepping signal is applied to the phase modulator.

In one embodiment, a method of frequency tuning a laser system includes: emitting light at changing target frequencies using a single phase locking tunable seed laser; modulating the light at a fixed frequency using at least one phase modulator, to generate fixed-frequency sidebands around changing frequency sidebands; receiving the phase modulated light at a frequency reference; detecting the phase-modulated light from the frequency reference and producing a first signal; demodulating the first signal at a fixed reference frequency to generate a frequency locking error signal; converting said error signal into a feedback signal, using a servo circuit, which is forwarded to said tunable seed laser; and outputting a feed-forward signal using a field-programmable gate array (FPGA), which feed-forward signal is forwarded to the tunable seed laser; wherein the feed-forward signal is sent to the tunable seed laser such that a laser frequency of the tunable seed laser falls proximate to an artificial locking frequency point; and wherein the feed-forward signal and a changing target frequency are synchronized and dynamically stepped by the FPGA, such that the laser frequency is controlled and locked to offset frequencies set by a list of said changing target frequency.

In one embodiment, the method further includes: outputting a second signal from the FGPA outputs a second signal back to the servo circuit.

In one embodiment, the method further includes: summing the feedback signal and the feed-forward signal; and driving the summed signal to said tunable seed laser.

In one embodiment, the method further includes: providing additional phase modulation onto a standard absolute frequency locking system to generate the artificial locking frequency point with a known frequency offset in an absolute frequency locking loop.

In one embodiment, the method further includes: generating two additional frequency locking error signals on both sides of the frequency locking error signal.

In one embodiment, the method further includes: locking the tunable seed laser to either side of the frequency reference.

In one embodiment, the method further includes: generating the changing target frequency from one of a tunable radio frequency (RF) signal generator or an array of RF switches connected to multiple fixed frequency RF signal generators.

Thus, has been outlined, some features consistent with the present invention in order that the detailed description thereof that follows may be better understood, and in order that the present contribution to the art may be better appreciated. There are, of course, additional features consistent with the present invention that will be described below and which will form the subject matter of the claims appended hereto.

In this respect, before explaining at least one embodiment consistent with the present invention in detail, it is to be understood that the invention is not limited in its application to the details of construction and to the arrangements of the components set forth in the following description or illustrated in the drawings. Methods and apparatuses consistent with the present invention are capable of other embodiments and of being practiced and carried out in various ways. Also, it is to be understood that the phraseology and terminology employed herein, as well as the abstract included below, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the methods and apparatuses consistent with the present invention.

BRIEF DESCRIPTION OF THE DRAWINGS

The description of the drawing is only one exemplary embodiment of the disclosure and not to be considered as limiting in scope.

The FIGURE shows a laser system and method which enables fast, accurate laser frequency tuning, according to one embodiment consistent with the present invention.

DESCRIPTION OF THE INVENTION

The present invention relates to a laser system and method which enables fast, accurate laser frequency tuning. In particular, the present invention includes only one laser and only one absolute frequency locking loop to perform the same fast frequency tuning than previous seed laser systems.

Accordingly, the present invention is directed to laser sources which assist programs that improve the ability to predict/model long-term changes in climate cycle based both on the understanding of the natural processes driving the variability of natural carbon sources and sinks, and on the transport of carbon through the atmosphere, as well as the methane lidar program.

In one exemplary embodiment, the fast-tunable seed laser system of the present invention includes only one fast-tunable laser, and does not involve any optical phase locked loop (OPLL), and its associated components. To perform the accurate, fast tuning of the laser frequency, extra phase modulation is added onto the standard absolute frequency locking system. The extra phase modulation generates artificial locking points with the known frequency offset (actual offset frequency minus target offset frequency) in the absolute frequency-locking loop.

In one exemplary embodiment, as shown in the FIGURE, the innovative fast-tunable laser system 100 of the present invention, includes phase-modulating a fast tunable seed laser 101 which emits light 102, at changing target frequencies (e.g., 0.5-20 GHz), and then phase modulating via phase modulators 103, 104 again at a fixed-frequency (e.g., 60 MHz). This procedure generates fixed-frequency sidebands around the changing frequency sidebands. With respect to the two phase modulators 103, 104, the double-phase-modulated light 102 goes through a frequency reference 105 (e.g., a gas cell), and then it is detected by a photo-detector 106 and passed through mixer circuit 107 to produce a signal 108.

In one exemplary embodiment, the electrical signal 108 from the photodetector 106, is demodulated at the fixed reference frequency to generate a frequency locking error signal 108, just like the standard frequency-locking servo loop based on the phase modulation technique. However, unlike the standard phase modulation, and in accordance with the unique arrangement and methods of the present invention, two extra locking error signals are generated on both sides of the main error signal 108, since the laser 101 has the extra changing-frequency sidebands in this scheme.

In one exemplary embodiment, a feed-forward signal 110 is applied to the tuning port of the seed laser 101, so that the laser frequency falls in the vicinity of the artificial locking frequency point. The feed-forward signal 110 and the changing target frequency are synchronized and dynamically stepped or swept, for example, by an FPGA 111.

In one embodiment, the FGPA outputs a second signal back to the servo circuit 109 in order to optimize the closed-loop performance. Specifically, in one exemplary embodiment, when the servo circuit 109 is engaged, the frequency locking servo circuit converts the error signal 108 into an appropriate feedback signal 113, and then the signal 113 is fed back to the tuning port of the seed laser 101 together with the feed-forward signal 113 via summing circuit 114 and driver 115. This way, the laser frequency is controlled and locked to the offset frequencies set by the changing target frequency list. Without changing the sign of the servo but optimizing its gain 112, the laser 101 can be locked to either side of the frequency reference (gas absorption peak), unlike the prior-art dynamic-OPLL scheme. The changing target frequency can be generated either from a fast-tunable radio frequency (RF) signal generator or an array of RF switches connected to multiple fixed frequency RF signal generators.

In one exemplary embodiment of the present invention, with respect to gas sensing lidars, an optical pulse train is emitted from a laser 101, whose frequency (wavelength) is stepped across the target gas absorption line. From the intensity variation of the returned pulses, the column average of the target gas can be measured along the optical path. The frequency (wavelength) of the laser pulse is precisely at the target frequencies selected to minimize the measurement error.

In one exemplary embodiment, a similar sideband structure can be generated using only one phase modulator 103 or 104, when a phase-modulated frequency stepping signal is applied to the phase modulator 103 or 104. This fast-tunable electronic sideband (ESB) scheme of the present invention differs from dual sideband (DSB) schemes in that ESB schemes do not create the fixed-frequency sideband around the carrier. Thus, the error signal is not created around the carrier, and thus, the system cannot lock onto the center line of the gas. Otherwise, the fast tunable ESB scheme can perform the same accurate tuning as a DSB scheme.

Thus, in one exemplary embodiment, the fast-tunable laser system of the present invention differs from the conventional phase modulation technique, because it utilizes the fast-tuning extra sideband that generates artificial locking points for the laser 101 to lock onto. Thus, this innovation adds the fast, accurate tuning capability to the standard static frequency locking system.

The advantage of the present invention is its extreme simplicity and its high tuning capability. Compared to conventional dynamic-OPLL schemes, the fast tunable laser system of the present invention has much less optics parts count, since the OPLL component is not required at all. While the dynamic-OPLL scheme required at least two lasers (static master and dynamic slave), the fast tunable laser system of the present invention requires only one dynamic master laser.

In one exemplary embodiment, since the laser is phase modulated twice to have the sideband of the sideband around the main carrier, the fast tunable laser may be a dual-sideband (DSB) locking laser. Further, in one exemplary embodiment, the fast-tunable DSB locking system can cover ~20 GHz tuning range at 100 micro-second timescale, and greatly enhances the capability and applicability to other systems.

Still further, in one exemplary embodiment, the tunable seed laser of the present invention is a digital-supermode distributed Bragg reflector (DS-DBR) tunable laser. However, one of ordinary skill in the art would know that any fast tunable laser may be used with the present invention.

In one exemplary embodiment, the control program is simplified, as it needs to control the switching RF signal, the feed-forward signal, and possibly the servo gain, only. The target frequency can be easily changed by changing the output frequency of the RF signal generator(s) and the feed-forward signal level. In the conventional dynamic-OPLL scheme, many parameters had to be changed at the same time considering various limitations of each RF component. In contrast, the new system of the present invention decreases the size, weight and power of the overall system drastically through its simplicity.

Since the system of the present invention can be implemented without any OPLL and be very simple, there are many commercial applications compared to the prior-art system, such as in industrial sectors making or using fast tunable lasers and laser sensing systems. The present technology will benefit space science, earth science, and planetary science missions that use precision lidar that require fast tuning seed lasers. It can also be used in in-situ sample analysis and chemical detection.

The laser sources of the present invention assist programs that improve the ability to predict/model long-term changes in climate cycle based both on the understanding of the natural processes driving the variability of natural carbon sources and sinks, and on the transport of carbon through the atmosphere, as well as the methane lidar program.

In the climate change programs of the present invention, the absolute laser frequency error is below ~10 MHz, the pulse switching time is 133 micro-seconds, and the entire scanning range is ~+−12 GHz. The basic laser seeder techniques and requirements for gas lidar missions are similar to those defined for the climate change programs.

It should be emphasized that the above-described embodiments of the invention are merely possible examples of implementations set forth for a clear understanding of the principles of the invention. Variations and modifications may be made to the above-described embodiments of the invention without departing from the spirit and principles of the invention. All such modifications and variations are intended to be included herein within the scope of the invention and protected by the following claims.

What is claimed is:

1. A laser frequency tuning system comprising:
   a single phase locking tunable seed laser which emits light at changing target frequencies;
   at least one phase modulator which modulates said light at a fixed frequency, to generate fixed-frequency sidebands around changing frequency sidebands;
   a frequency reference which receives said phase-modulated light;
   a detector which detects said phase-modulated light from said frequency reference and produces a first signal;
   a mixer circuit which demodulates said first signal from said detector at a fixed reference frequency to generate a frequency locking error signal;
   a servo circuit which converts said error signal into a feedback signal which is forwarded to said tunable seed laser; and
   a field-programmable gate array (FPGA) which outputs a feed-forward signal, which is forwarded to said tunable seed laser;
   wherein said feed-forward signal is sent to said tunable seed laser such that a laser frequency of said tunable seed laser falls proximate to an artificial locking frequency point; and
   wherein said feed-forward signal and a changing target frequency are synchronized and dynamically stepped by said FPGA, such that said laser frequency is controlled and locked to offset frequencies set by a list of said changing target frequency.

2. The laser frequency tuning system of claim 1, wherein said FGPA outputs a second signal back to said servo circuit to optimize a closed-loop performance.

3. The laser frequency tuning system of claim 2, further comprising:
   a summing circuit which adds said feedback signal and said feed-forward signal; and
   a current driver which drives said summed signal to said tunable seed laser.

4. The laser frequency tuning system of claim 3, wherein said tunable seed laser is a digital-supermode distributed Bragg reflector (DS-DBR) tunable laser.

5. The laser frequency tuning system of claim 3, wherein said tunable seed laser is a dual sideband (DSB) locking tunable laser which includes two phase modulators which phase modulate said tunable seed laser twice.

6. The laser frequency tuning system of claim 5, wherein said DSB locking tunable laser covers 20 GHz tuning range at a 100 micro-second timescale.

7. The laser frequency tuning system of claim 3, wherein additional phase modulation is added onto a standard absolute frequency locking system to generate said artificial locking frequency point with a known frequency offset in an absolute frequency locking loop.

8. The laser frequency tuning system of claim 6, wherein two additional frequency locking error signals are generated on both sides of said frequency locking error signal.

9. The laser frequency tuning system of claim 1, wherein said tunable seed laser can be locked to either side of said frequency reference.

10. The laser frequency tuning system of claim 1, wherein said changing target frequency is generated from one of a tunable radio frequency (RF) signal generator or an array of RF switches connected to multiple fixed frequency RF signal generators.

11. The laser frequency tuning system of claim 1, wherein said phase modulator is a single phase modulator used to generate a sideband structure.

12. The laser frequency tuning system of claim 11, wherein a phase-modulated frequency stepping signal is applied to said phase modulator.

13. A method of frequency tuning a laser system comprising:
    emitting light at changing target frequencies using a single phase locking tunable seed laser;
    modulating said light at a fixed frequency, to generate fixed-frequency sidebands around changing frequency sidebands using at least one phase modulator;
    receiving said phase modulated light at a frequency reference;
    detecting said phase-modulated light from said frequency reference and producing a first signal;
    demodulating said first signal at a fixed reference frequency to generate a frequency locking error signal;
    converting said error signal into a feedback signal, using a servo circuit, which is forwarded to said tunable seed laser; and
    outputting a feed-forward signal using a field-programmable gate array (FPGA), which feed-forward signal is forwarded to said tunable seed laser;
    wherein said feed-forward signal is sent to said tunable seed laser such that a laser frequency of said tunable seed laser falls proximate to an artificial locking frequency point; and
    wherein said feed-forward signal and a changing target frequency are synchronized and dynamically stepped by said FPGA, such that said laser frequency is controlled and locked to offset frequencies set by a list of said changing target frequency.

14. The method of claim 13, further comprising:
    outputting a second signal from said FGPA outputs a second signal back to said servo circuit.

15. The method of claim 14, further comprising:
    summing said feedback signal and said feed-forward signal; and
    driving said summed signal to said tunable seed laser.

16. The method of claim 15, wherein said tunable seed laser is a digital-supermode distributed Bragg reflector (DS-DBR) tunable laser.

17. The method of claim 15,
wherein said tunable seed laser is a dual sideband (DSB) locking tunable laser which includes two phase modulators which phase modulate said tunable seed laser twice.

18. The method of claim 17,
wherein said DSB locking tunable laser covers 20 GHz tuning range at a 100 micro-second timescale.

19. The method of claim 15, further comprising:
providing additional phase modulation onto a standard absolute frequency locking system to generate said artificial locking frequency point with a known frequency offset in an absolute frequency locking loop.

20. The method of claim 19, further comprising:
generating two additional frequency locking error signals on both sides of said frequency locking error signal.

21. The method of claim 13, further comprising:
locking said tunable seed laser to either side of said frequency reference.

22. The method of claim 13, further comprising:
generating said changing target frequency from one of a tunable radio frequency (RF) signal generator or an array of RF switches connected to multiple fixed frequency RF signal generators.

23. The method of claim 13,
wherein said phase modulator is a single phase modulator used to generate a sideband structure.

24. The method of claim 23,
wherein a phase-modulated frequency stepping signal is applied to said phase modulator.

* * * * *